United States Patent
Tseng et al.

(10) Patent No.: US 12,426,201 B2
(45) Date of Patent: Sep. 23, 2025

(54) POWER SUPPLY DEVICE COMBINED WITH VIBRATION-RESISTANT FAN ASSEMBLY HAVING ILLUMINATED HANDLE

(71) Applicant: DELTA ELECTRONICS, INC., Taoyuan (TW)

(72) Inventors: Chi-Yuan Tseng, Taoyuan (TW); Chien-Feng Chuang, Taoyuan (TW); Chi-Shou Ho, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 208 days.

(21) Appl. No.: 18/376,834

(22) Filed: Oct. 5, 2023

(65) Prior Publication Data

US 2024/0414877 A1    Dec. 12, 2024

(30) Foreign Application Priority Data

Jun. 6, 2023 (CN) .......................... 202310660362.2

(51) Int. Cl.
*H05K 7/20*    (2006.01)

(52) U.S. Cl.
CPC ..... *H05K 7/20172* (2013.01); *H05K 7/20909* (2013.01)

(58) Field of Classification Search
CPC ........................ H05K 7/20172; H05K 7/20909
See application file for complete search history.

(56) References Cited

U.S. PATENT DOCUMENTS

| | | |
|---|---|---|
| 2005/0139348 A1 | 6/2005 | Lu et al. |
| 2013/0202429 A1 | 8/2013 | Kuo et al. |

(Continued)

FOREIGN PATENT DOCUMENTS

| | | |
|---|---|---|
| CN | 202603074 U | 12/2012 |
| CN | 205544954 U | 8/2016 |

(Continued)

OTHER PUBLICATIONS

Office Action dated Feb. 23, 2024 of the corresponding Taiwan patent application No. 112120977.
Search Report dated Mar. 13, 2024 of the corresponding European patent application No. 23202242.6.

(Continued)

*Primary Examiner* — Mukundbhai G Patel
(74) *Attorney, Agent, or Firm* — HDLS IPR SERVICES; Chun-Ming Shih

(57) ABSTRACT

This disclosure is a power supply device including a device body, a fan assembly, an illuminated handle assembly and shock-absorbing fastening elements. The fan assembly is combined in the device body and includes a bracket and a fan, and the bracket includes through holes. The illuminated handle assembly includes a handle, an electrical connecting element, and light-emitting elements. The handle is combined on the bracket and attached to the light-emitting element. The light-emitting element is electrically connected to the electrical connecting element. Each shock-absorbing fastening element is disposed in the fan assembly by each through hole to fix the light-emitting element on a side of the bracket facing the handle. The power supply device controls the light-emitting element through the electrical connecting element. Therefore, the vibration and noise generated during the operation of the fan assembly are reduced, and a power supply device combined with an illuminated handle is provided.

10 Claims, 8 Drawing Sheets

(56) References Cited

U.S. PATENT DOCUMENTS

| | | | |
|---|---|---|---|
| 2018/0070473 A1* | 3/2018 | Zhang | G06F 1/181 |
| 2018/0100512 A1 | 4/2018 | Chen et al. | |
| 2019/0182982 A1 | 6/2019 | Gopalakrishna et al. | |
| 2019/0317577 A1 | 10/2019 | Lin et al. | |
| 2020/0303883 A1 | 9/2020 | Li et al. | |
| 2020/0341188 A1 | 10/2020 | Diana et al. | |
| 2022/0354023 A1* | 11/2022 | Fan | H05K 7/1492 |
| 2024/0040739 A1* | 2/2024 | Park | H05K 7/20154 |

FOREIGN PATENT DOCUMENTS

| | | |
|---|---|---|
| CN | 208442043 U | 1/2019 |
| CN | 212515613 U | 2/2021 |
| EP | 331014 A1 | 4/2018 |
| TW | 201500650 A | 1/2015 |
| TW | M610148 U | 4/2021 |
| WO | 2010138824 A2 | 12/2010 |

OTHER PUBLICATIONS

Search Report dated Jul. 9, 2024 of the related European patent application No. 24178270.5.
Office Action dated Oct. 15, 2024 of the relating Taiwan patent application No. 113109158.

* cited by examiner

POWER SUPPLY DEVICE COMBINED WITH VIBRATION-RESISTANT FAN ASSEMBLY HAVING ILLUMINATED HANDLE

BACKGROUND OF THE DISCLOSURE

Technical Field

The technical field relates to a power supply device, and more particularly, to a power supply device combined with an illuminated handle.

Description of Related Art

The Open Compute Project (OCP) organization provides the requirement for the Modular Hardware System-Common Redundant Power Supply (M-CRPS) with the usage of illuminated handles. The configuration involves disposing electrical connectors on the rear side of the handle and connecting them to the rear control board for controlling and provides the power required for the operation of the illuminated handle.

Furthermore, a power supply device is usually equipped with a fan assembly to facilitate the cooling of electronic components inside the device. An existing fan assembly includes a bracket and a fan. The fan is combined in the bracket by screws, and the bracket is then combined with the device for integration. However, vibrations may be generated during the operation of the fan. Thus, how to reduce the vibrations and noise generated by the fan assembly during operation and to combine the illuminated handle with the fan assembly to meet the M-CRPS specification are the research motivations of the inventor.

In view of the above drawbacks, the inventor proposes this disclosure based on his expert knowledge and elaborate researches in order to solve the problems of related art.

SUMMARY OF THE DISCLOSURE

This disclosure is a power supply device combined with a vibration-resistant fan assembly having an illuminated handle, which the vibration and noise generated during the operation of the fan assembly may be reduced, and an illuminated handle structure is combined with the fan assembly.

This disclosure is a power supply device combined with a vibration-resistant fan assembly having an illuminated handle, the power supply device includes a device body, a fan assembly, an illuminated handle assembly and a plurality of shock-absorbing fastening elements. The fan assembly is combined in the device body and includes a bracket and a fan combined in the bracket, and the bracket includes a plurality of through holes. The illuminated handle assembly includes a handle, an electrical connecting element, and at least one light-emitting element. The handle is combined with the bracket and attached to the at least one light-emitting element. The at least one light-emitting element is electrically connected to the electrical connecting element. Each shock-absorbing fastening element is disposed in the fan assembly by each through hole to fix the at least one light-emitting element on a side of the bracket facing the handle. The power supply device controls the at least one light-emitting element through the electrical connecting element.

In comparison with the related art, the power supply device combined with a vibration-resistant fan assembly having an illuminated handle of this disclosure inserts the shock-absorbing fastening elements to the through holes of the bracket to be combined with the fan. Furthermore, the fan is attached to the through holes of the bracket through the shock-absorbing fastening elements. As a result, vibrations generated during the operation of the fan may not be transferred to the power supply device. Additionally, the shock-absorbing fastening elements may also position the light-emitting element. The light emitted from the light-emitting element enters the handle to form an illuminated handle. Therefore, users may identify the position of the handle and extract the power supply device under environments with insufficient lighting.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
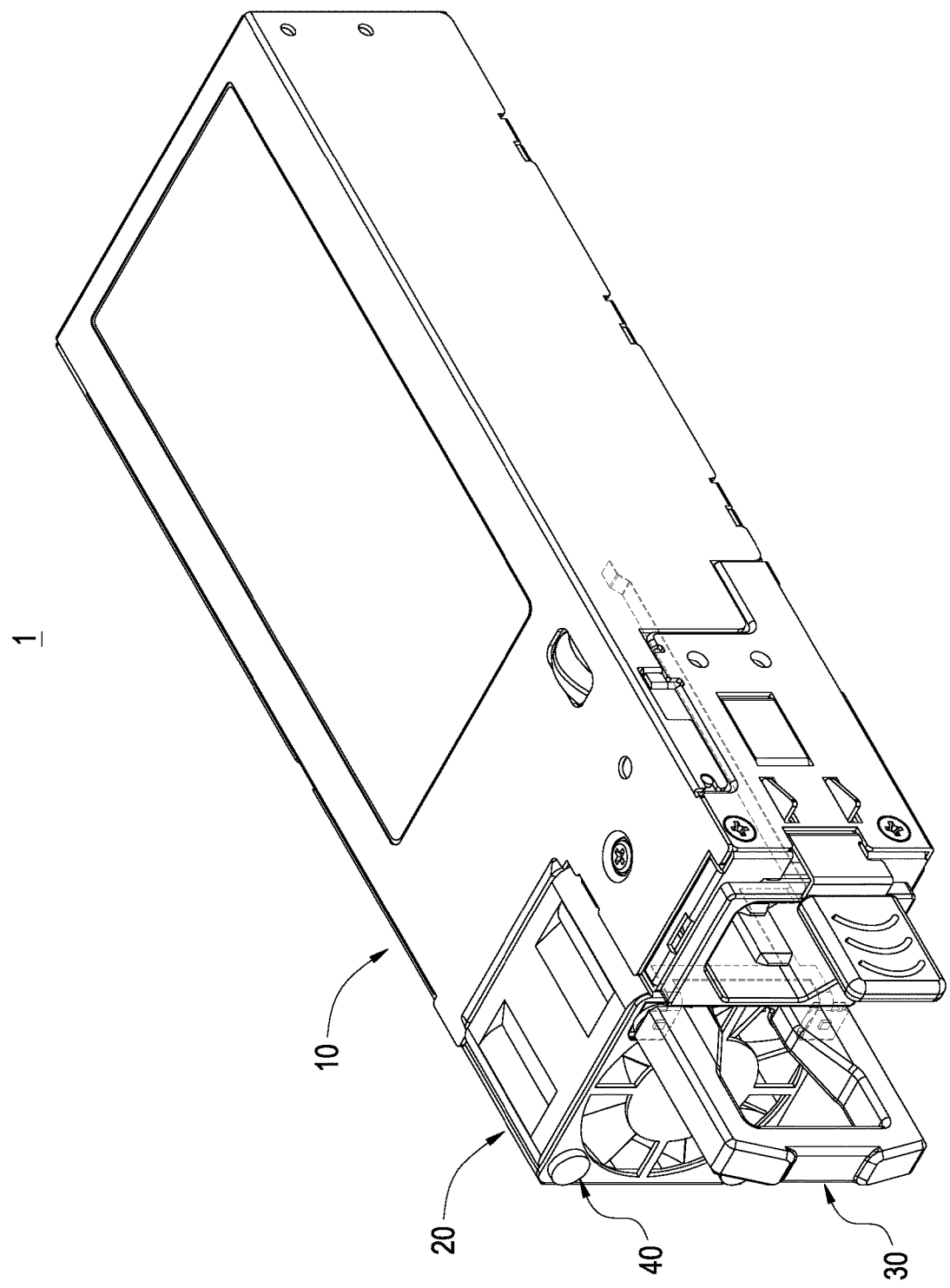
FIG. 1 is a perspective schematic view of the power supply device combined with a vibration-resistant fan assembly having an illuminated handle in this disclosure.

Please refer to FIG. 1, which is a perspective schematic view of the power supply device combined with a vibration-resistant fan assembly having an illuminated handle in this disclosure. This disclosure is a power supply device 1 combined a vibration-resistant fan assembly having an illuminated handle, the power supply device 1 includes a device body 10, a fan assembly 20, an illuminated handle assembly 30 and a plurality of shock-absorbing fastening elements 40. The fan assembly 20 is disposed in the device body 10. The illuminated handle assembly 30 is combined on the fan assembly 20, and the power supply device 1 may be extracted by exerting a force to the illuminated handle assembly 30. Additionally, the shock-absorbing fastening elements 40 are inserted in the fan assembly 20.

Figure 2:
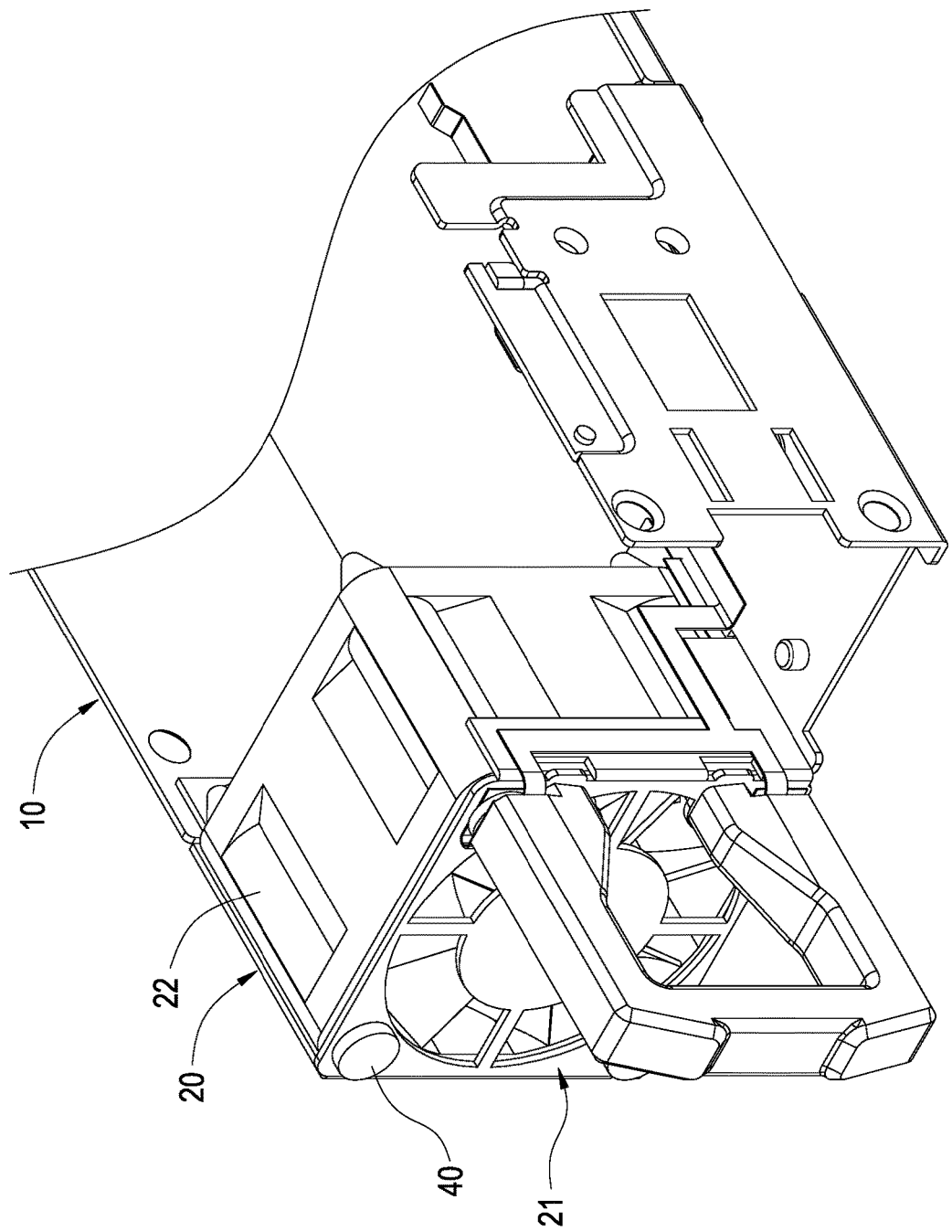
FIG. 2 is a perspective schematic view of the vibration-resistant fan assembly in this disclosure.
Figure 3:
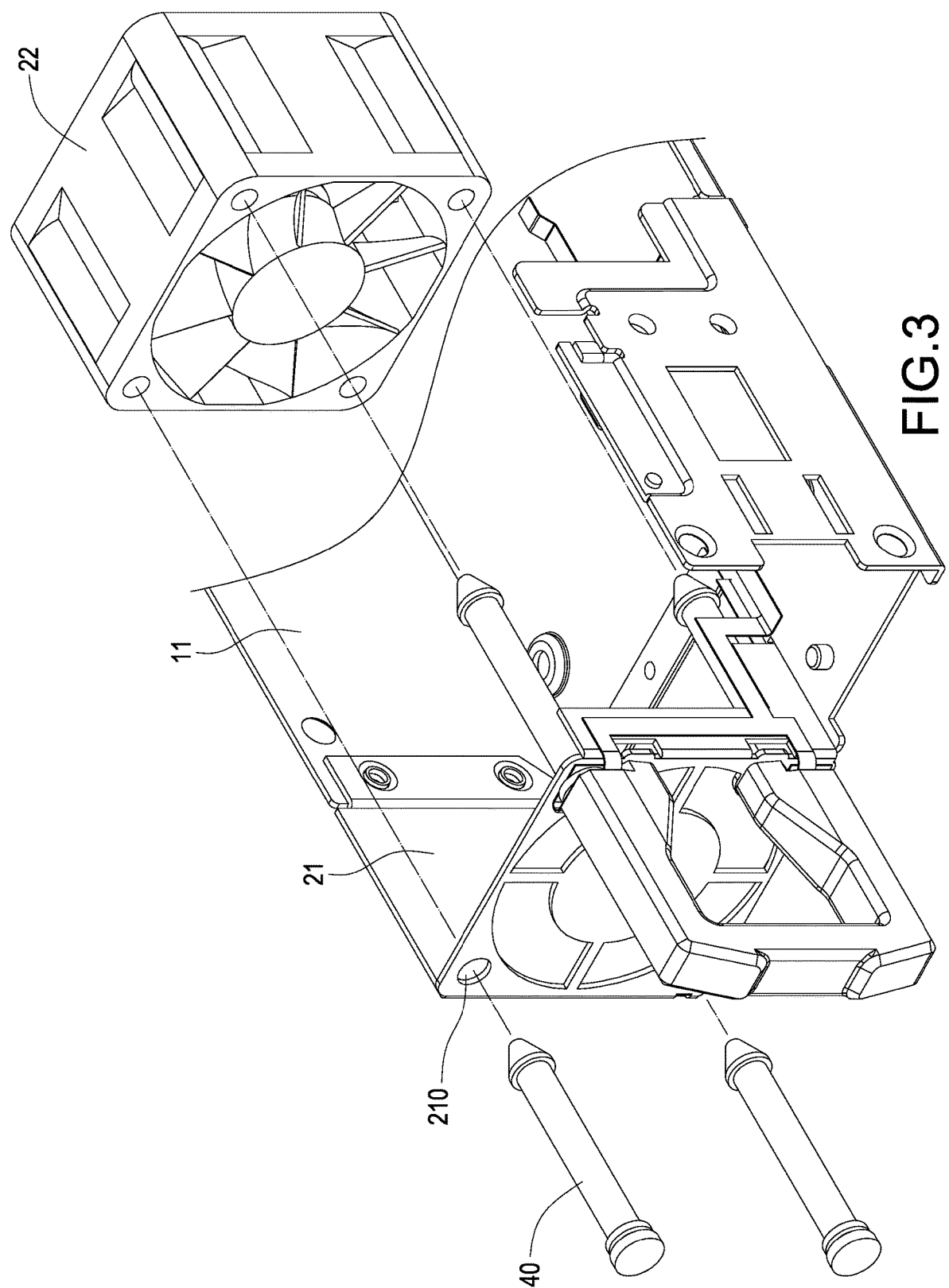
FIG. 3 is a perspective exploded schematic view of the vibration-resistant fan assembly in this disclosure.

Please refer to FIG. 2 and FIG. 3, which are a perspective schematic view of the vibration-resistant fan assembly in this disclosure and a perspective exploded schematic view of the vibration-resistant fan assembly in this disclosure. The device body 10 includes a case 11. Additionally, the fan assembly 20 is combined in the device body 10. The fan assembly 20 includes a bracket 21 and a fan 22 combined in the bracket 21, and the bracket 21 includes a plurality of through holes 210. Furthermore, the shock-absorbing fastening elements 40 are disposed between the bracket 21 and the fan 22. The fan 22 is attached to the bracket 21 by the shock-absorbing fastening elements 40. As a result, vibrations generated during the operation of the fan 22 may not be transferred to the power supply device 1.

In this embodiment, each shock-absorbing fastening element 40 is, but not limited to, a vibration-dampening rubber rivet.

Figure 4:
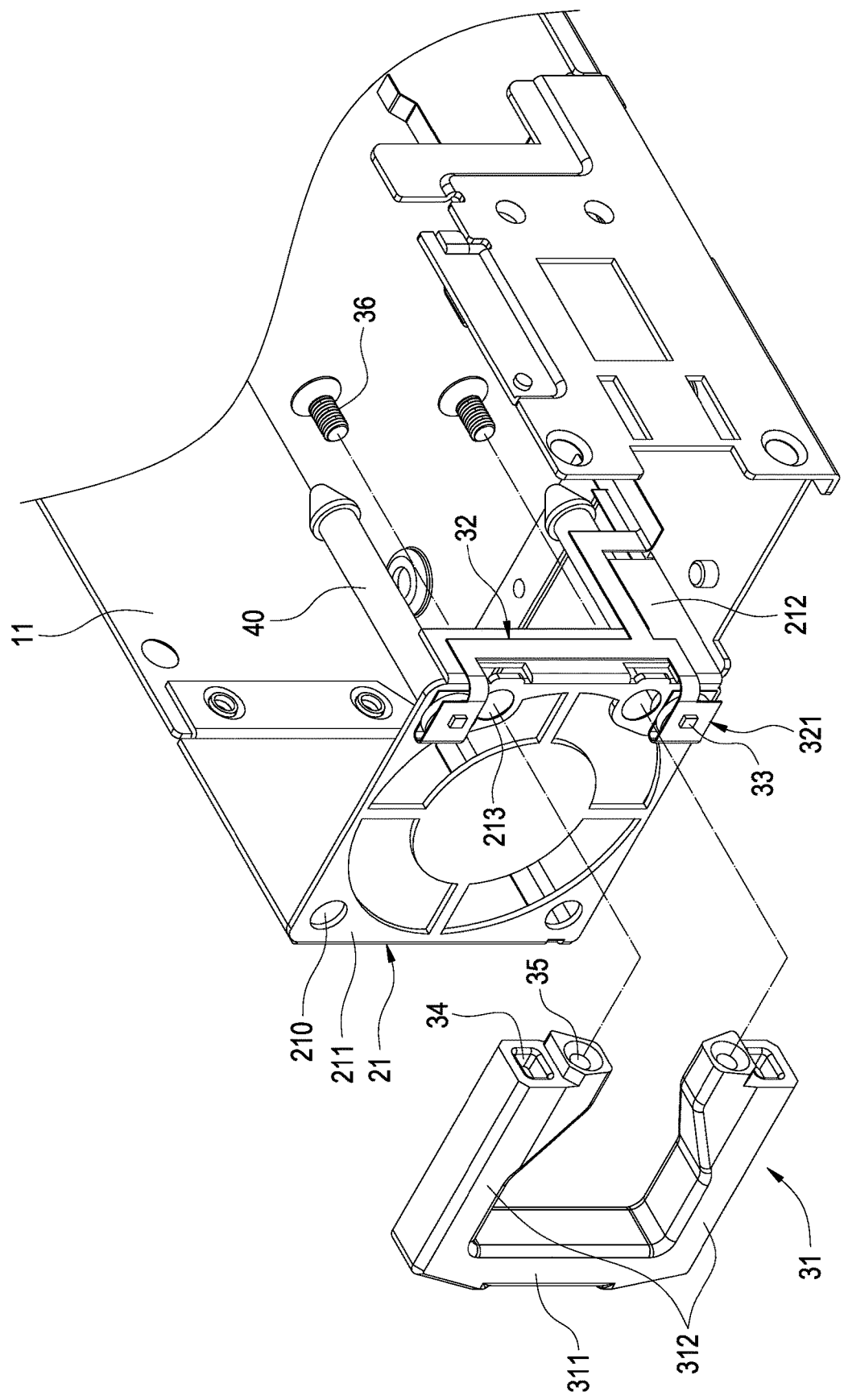
FIG. 4 is a combination schematic view of the illuminated handle assembly in this disclosure.
Figure 5:
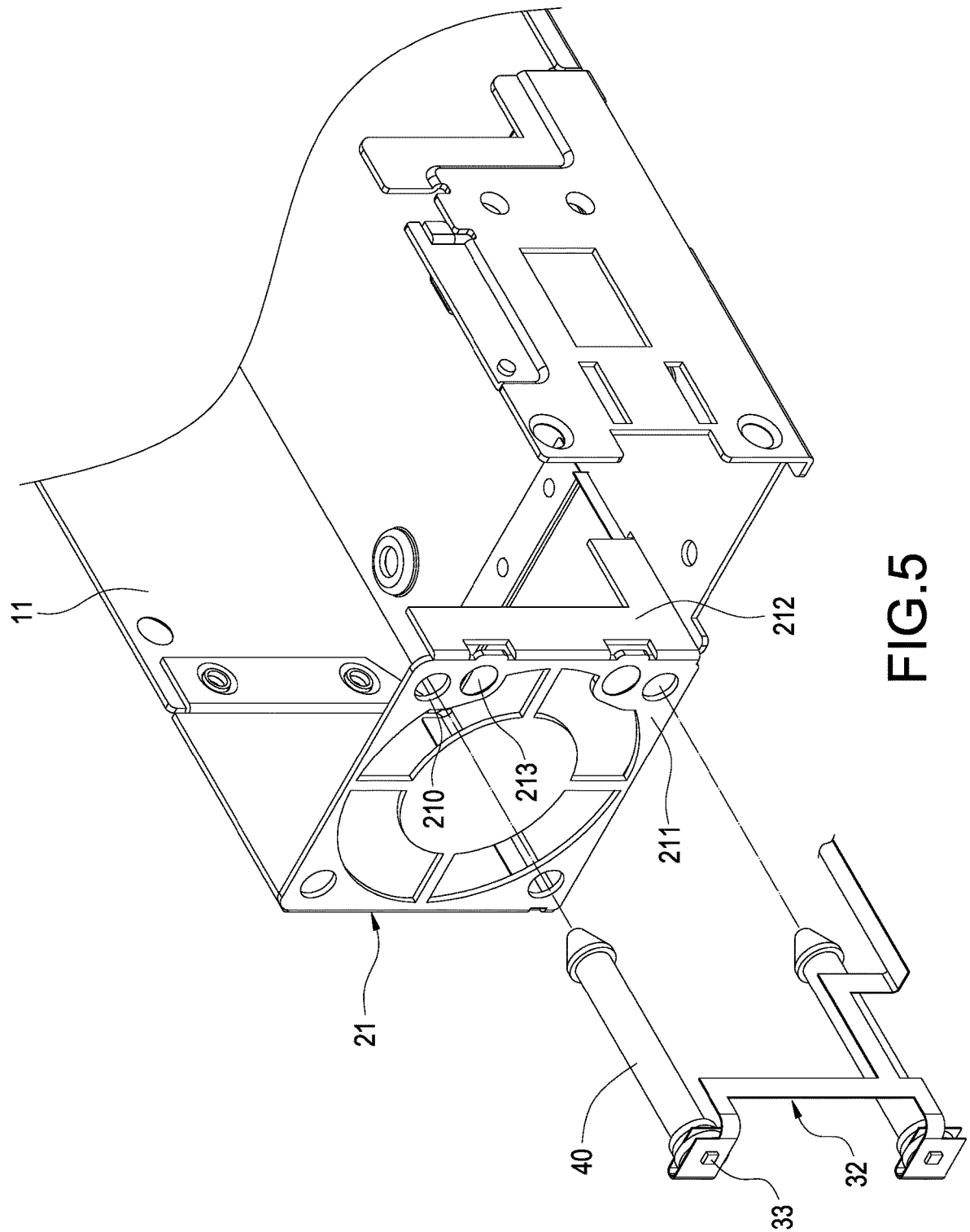
FIG. 5 is a combination schematic view of the electrical connecting element and the shock-absorbing fastening elements in this disclosure.
Figure 6:
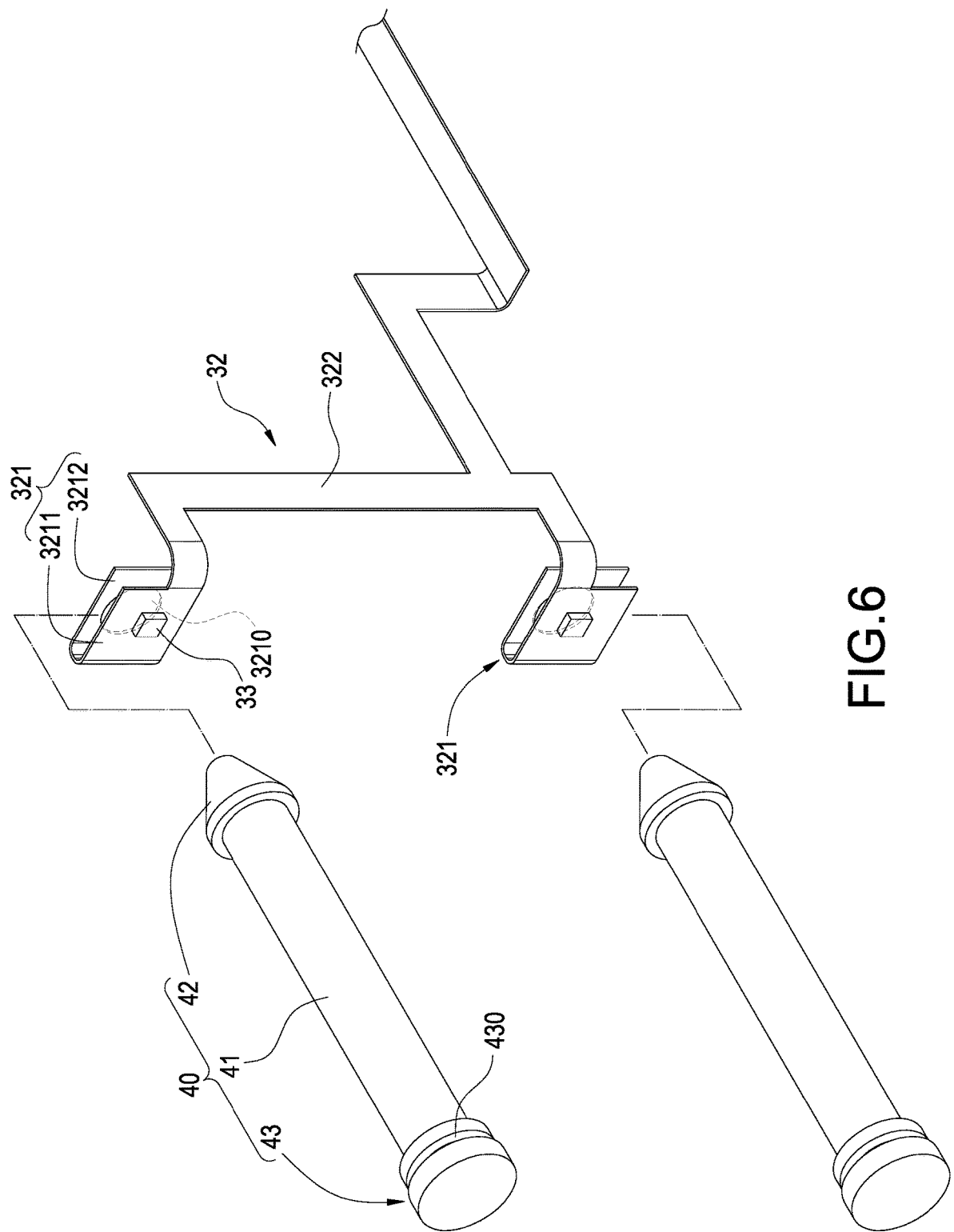
FIG. 6 is a perspective exploded schematic view of the electrical connecting element and the shock-absorbing fastening elements in this disclosure.

Please further refer to FIG. 4 to FIG. 6, which are a combination schematic view of the illuminated handle assembly in this disclosure, a combination schematic view of the electrical connecting element and the shock-absorbing fastening element in this disclosure, and a perspective exploded schematic view of the electrical connecting element and the shock-absorbing fastening element in this disclosure. As shown in FIG. 4 and FIG. 5, the illuminated handle assembly 30 includes a handle 31 and at least one light-emitting element 33. In some embodiments, the light-emitting element 33 is, but not limited to, an LED. In this embodiment, the illuminated handle assembly 30 further includes an electrical connecting element 32, and the at least one light-emitting element 33 is disposed on the electrical connecting element 32. Specifically, the electrical connecting element 32 further includes a flexible printed circuit (FPC).

Moreover, the handle 31 may be made of transparent plastic. The handle 31 is a U-shaped handle and includes a gripping section 311 and a pair of supporting sections 312 connected to the gripping section 311. Two ends of the pair of supporting sections 312 are fixed on one side of the bracket 21. The light-emitting element 33 is disposed on the side of the electrical connecting element 32 facing the handle 31.

Specifically, the handle 31 is combined on the outer side of the bracket 21 away from the case 11 and attached to the light-emitting element 33. The light emitted from the light-emitting element 33 may penetrate into the handle 31 to make the handle 31 form an illuminated handle. Thus, users may identify the position of the handle 31 and extract the power supply device 1 under environments with insufficient lighting.

Please refer to FIG. 4, a light guiding hole 34 and a screw hole 35 are disposed on the end surface of the supporting section 312 of the handle 31. The light guiding hole 34 is disposed corresponding to the location of the light-emitting element 33. Additionally, the handle 31 is combined with the bracket 21 by a plurality of screws 36 passing through the through holes 210 of the bracket 21 and the screw holes 35. In some embodiments, the light guiding hole 34 is disposed corresponding to the supporting section 312. Moreover, the screw hole 35 is disposed on one side of the light guiding hole 34 and misaligned from the light guiding hole 34 to avoid blocking the light emitted from the light-emitting element 33 for a better light guiding.

Please refer to FIG. 5, in this embodiment, the bracket 21 is provided with a pair of through holes 210 and a pair of mounting holes 213 on the side where the handle 31 is combined. Each through hole 210 is inserted by a shock-absorbing fastening element 40, and a screw 36 is inserted in each mounting hole 213 (refer to FIG. 4).

In this embodiment, the electrical connecting element 32 includes two U-shaped flexible boards 321 disposed parallelly and an extending flexible board 322 connected with the two U-shaped flexible boards 321. Each U-shaped flexible board 321 is combined with one light-emitting element 33, and the two U-shaped flexible boards 321 are positioned on two end surfaces of the handle 31.

In one embodiment of this disclosure, the bracket 21 includes a motherboard 211 and an L side plate 212 connected to the motherboard 211. Moreover, the extending flexible board 322 is L-shaped and attached (adhered) to the L side plate 212.

As shown in FIG. 6, in more detail, each U-shaped flexible board 321 includes a first flexible board 3211 and a second flexible board 3212 connected to the extending flexible board 322. The light-emitting element 33 is disposed on the first flexible board 3211. A perforation 3210 is disposed on the second flexible board 3212 and inserted by a shock-absorbing fastening element 40.

Furthermore, the shock-absorbing fastening element 40 is made of flexible material, such as rubber. Each shock-absorbing locking element 40 passes through the electrical connecting element 32, and the other end of the each shock-absorbing locking element 40 pass through each through hole 210 to be disposed in the fan assembly 20. Therefore, the light-emitting element 33 is fixed on the outer side of the bracket 21 facing the handle 31.

In this embodiment, each shock-absorbing fastening element 40 includes a rod body 41, a head portion 42 formed at one end of the rod body 41 and a tail portion 43 formed at another end of the rod body 41. Additionally, a groove 430 is disposed on the tail portion 43. Each shock-absorbing fastening element 40 passes through the perforation 3210 of the second flexible board 3212. Therefore, the second flexible board 3212 is positioned in the groove 430 to be combined with the U-shaped flexible board 321.

Figure 7:
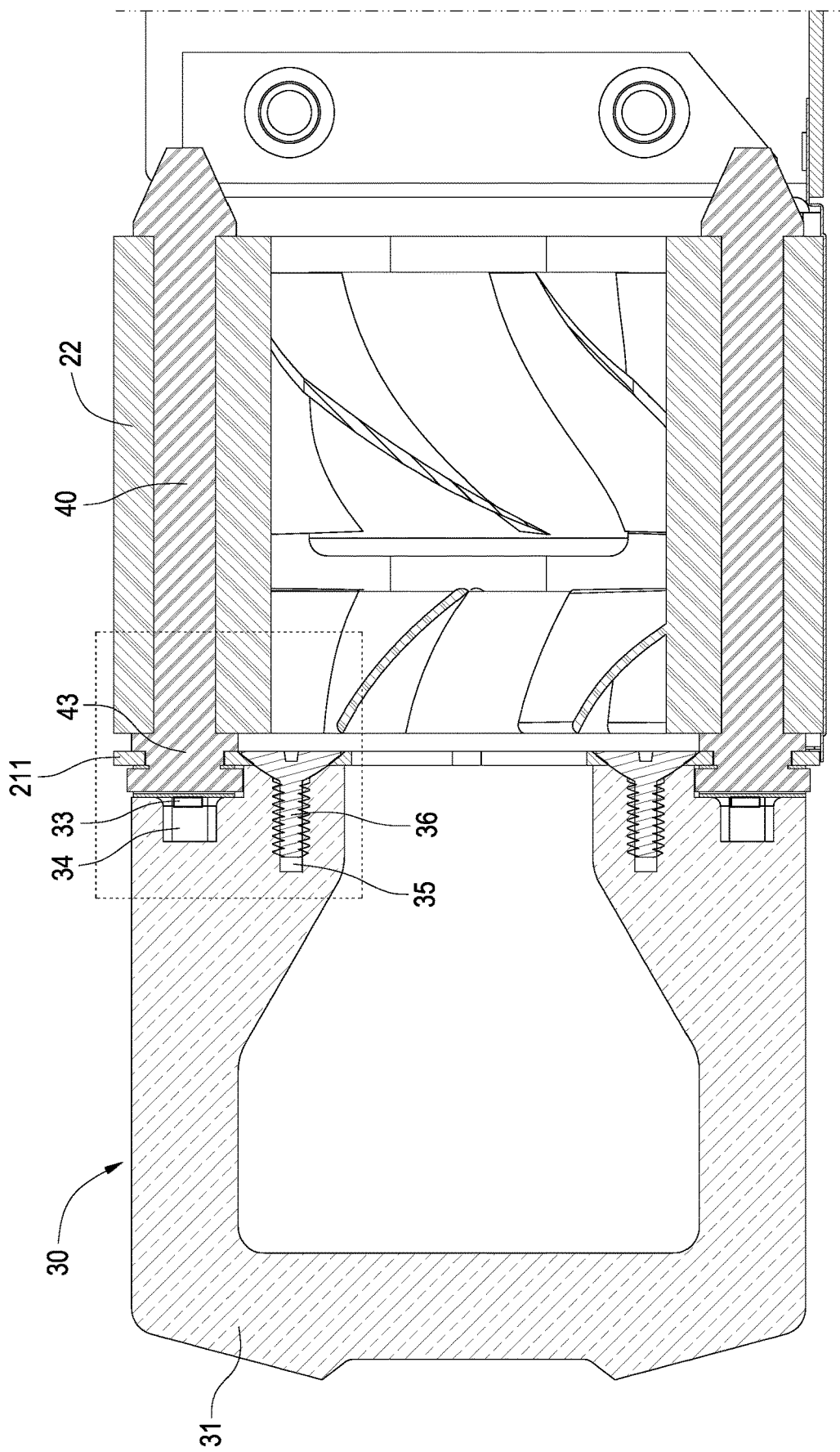
FIG. 7 is a cross sectional view of the power supply device combined with a vibration-resistant fan assembly having an illuminated handle in this disclosure.
Figure 8:
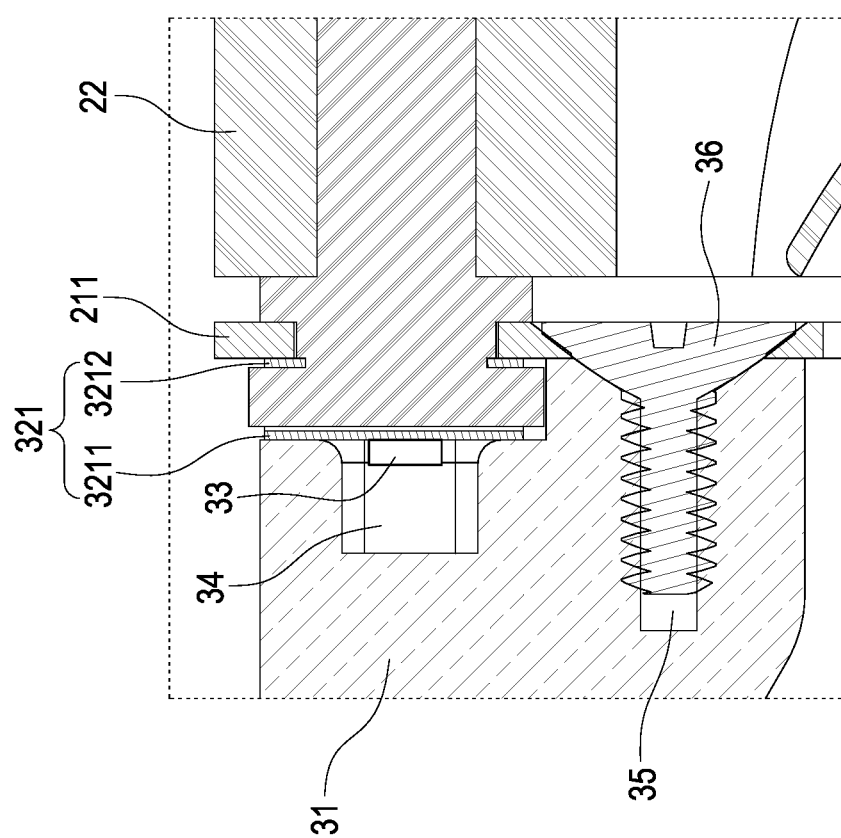
FIG. 8 is a partially enlarged view of FIG. 7.

Please further refer to FIG. 7 and FIG. 8, which are a cross sectional view of the power supply device combined a vibration-resistant fan assembly having an illuminated handle in this disclosure, and a partially enlarged view of FIG. 8. The power supply device 1 of this disclosure is assembled as follows. First, the shock-absorbing fastening elements 40 passes through the U-shaped flexible board 321 of the electrical connecting element 32. Then, the head portions 42 of the shock-absorbing fastening elements 40 passes through the through holes 210 of the bracket 21. Finally, the head portions 42 passes through the frame of the fan 22. Moreover, the electrical connecting element 32 is provided with the light-emitting element 33 disposed on one side of the U-shaped flexible board 321 facing the handle 31.

It should be noted that the fan 22 is attached on the location of the through holes 210 of the bracket 21 by the shock-absorbing fastening elements 40. Accordingly, vibrations generated during the operation of the fan 22 may not be transferred to the power supply device 1. Therefore, the shock-absorbing fastening elements 40 may absorb the vibrations generated by the fan assembly 20 to provide excellent vibration resistance, and also position the electrical connecting element 32 and the light-emitting element 33.

Moreover, the handle 31 is fastened to the bracket 21 by the screws 36. As a result, the light emitted from the light-emitting element 33 enters the handle 31 to form an illuminated handle. Therefore, users may identify the position of the handle 31 under environments with insufficient lighting, and extract the power supply device 1.

While this disclosure has been described by means of specific embodiments, numerous modifications and variations could be made thereto by those skilled in the art without departing from the scope and spirit of this disclosure set forth in the claims.

What is claimed is:

1. A power supply device, comprising:
   a device body;
   a fan assembly, combined in the device body, comprising a bracket and a fan combined in the bracket, and the bracket comprising a plurality of through holes;
   an illuminated handle assembly, comprising a handle, an electrical connecting element and at least one light-emitting element, the handle combined with the bracket and attached to the at least one light-emitting element, the at least one light-emitting element electrically connected to the electrical connecting element; and
   a plurality of shock-absorbing fastening elements, inserted in the fan assembly through the plurality of through holes to fix the at least one light-emitting element on a side of the bracket facing the handle;
   wherein the power supply device is configured to control the at least one light-emitting element through the electrical connecting element.

2. The power supply device according to claim 1, wherein the electrical connecting element further comprises a flexible circuit board, and the at least one light-emitting element is disposed on the electrical connecting element.

3. The power supply device according to claim 2, wherein the electrical connecting element comprises two U-shaped flexible boards disposed parallelly and an extending flexible board connected to the two U-shaped flexible boards, each U-shaped flexible boards is combined with one light-emitting element and positioned on each end surface of the handle.

4. The power supply device according to claim 3, wherein each of the U-shaped flexible boards comprises a first flexible board and a second flexible board connected to the extending flexible board, the light-emitting element is disposed on the first flexible board, a perforation is defined on the second flexible board and inserted by one of the shock-absorbing fastening elements.

5. The power supply device according to claim 4, wherein each of the shock-absorbing fastening elements comprises a rod body, a head portion disposed on one end of the rod body and a tail portion disposed on another end of the rod body, a groove is defined on the tail portion, each of the shock-absorbing fastening elements is inserted in the perforation to make the second flexible board be positioned in the groove.

6. The power supply device according to claim 3, wherein the bracket comprises a motherboard and an L side plate connected to the motherboard, the extending flexible board is L-shaped and attached to the L side plate.

7. The power supply device according to claim 3, wherein the handle comprises a gripping section and a pair of supporting sections connected to the gripping section, the pair of supporting sections are fixed on one side of the bracket; and
   a light guiding hole and a screw hole are defined on an end surface of each supporting section, the light guiding hole is defined corresponding to the light-emitting element, and the handle is fixed on the bracket through a plurality of screws passing through the bracket and the screw hole.

8. The power supply device according to claim 7, wherein the screw hole is defined on a side of the light guiding hole and misaligned from the light guiding hole.

9. The power supply device according to claim 7, wherein the bracket comprises a pair of through holes and a pair of mounting holes defined on a side thereof combined with the handle, each through hole is inserted by one of the shock-absorbing fastening elements, and each mounting hole is inserted by a screw.

10. The power supply device according to claim 1, wherein each shock-absorbing fastening element is made of a rubber.

* * * * *